United States Patent [19]

Prott et al.

[11] Patent Number: 4,825,015

[45] Date of Patent: Apr. 25, 1989

[54] ELECTROMAGNETIC SHIELDING ARRANGEMENT

[75] Inventors: Albert Prott, Bremen; Peter W. Prendel, Weyhe; Wilfried H. K. Kandler, Achim; Jürgen Sandkuhl, Weyhe-Leeste, all of Fed. Rep. of Germany

[73] Assignee: U.S. Philips Corporation, New York, N.Y.

[21] Appl. No.: 151,770

[22] Filed: Feb. 3, 1988

[30] Foreign Application Priority Data

Feb. 7, 1987 [DE] Fed. Rep. of Germany ....... 3703788

[51] Int. Cl.$^4$ ...................... H05K 9/00; G12B 17/02; F16J 15/12; B65D 53/00
[52] U.S. Cl. .............................. 174/35 GC; 220/378; 277/189
[58] Field of Search .......... 174/17 CT, 35 R, 35 GC, 174/35 MS, 50, 52 S; 361/424; 219/10.55 D; 220/3.8, 344, 378; 277/166, 189, 216, 220, 901; 49/486, 489; 200/302.1; 285/379

[56] References Cited

U.S. PATENT DOCUMENTS 4,699,293 10/1987 Duchrow .......................... 220/378

Primary Examiner—Laramie E. Askin

[57] ABSTRACT

A shielding string having a conductive surface is arranged between the surface of two juxtaposed parts of a housing for electronic circuits in a groove in one of the housing parts in order to attain shielding against high frequency. This shielding string is arranged before the assembling operation and can readily fall out again prematurely. In order to prevent it from falling out, the form of the groove has several abrupt changes in direction so that the shielding string is pressed against the walls of the groove due to its natural rigidity. Especially with the use of a shielding string with a wire texture at the surface, the grooves are widened in the proximity of the surface.

6 Claims, 1 Drawing Sheet

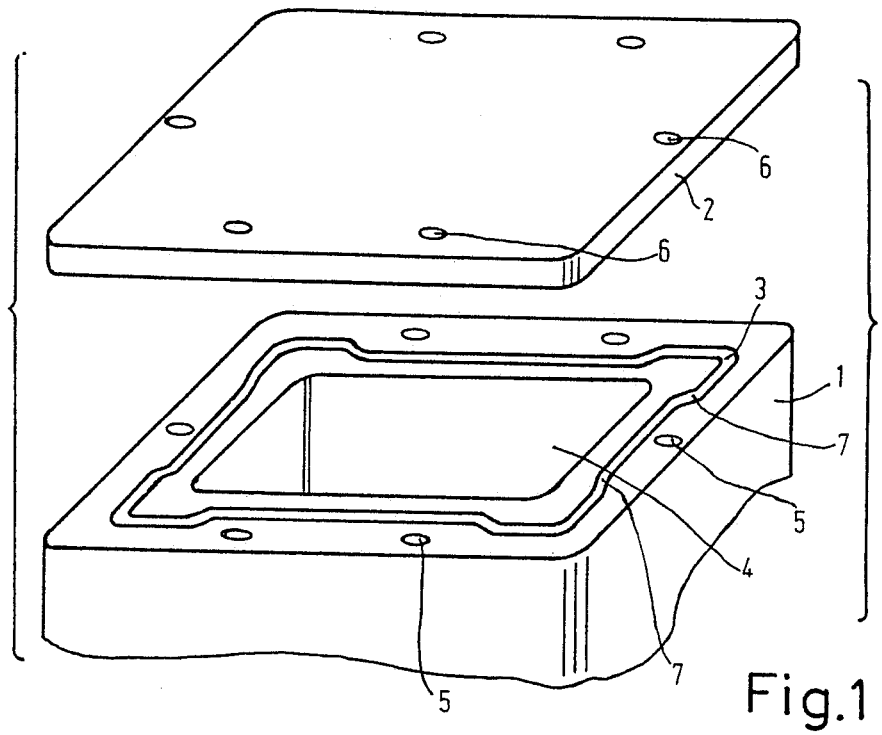
Fig.1
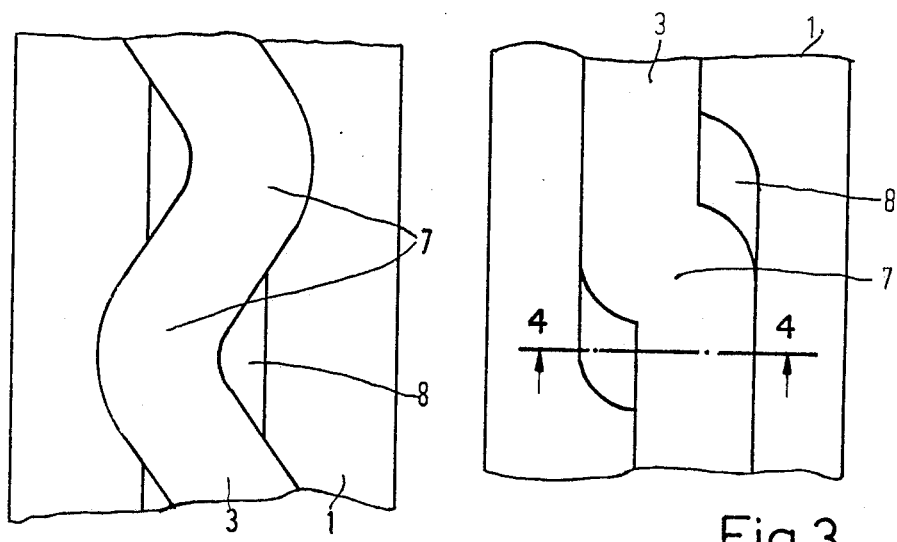
Fig.2
Fig.3
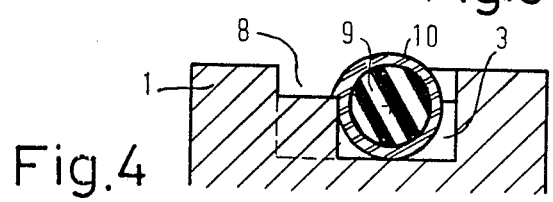
Fig.4

ELECTROMAGNETIC SHIELDING ARRANGEMENT

The invention relates to an electromagnetic shielding arrangement with a stranded soft elastic shielding body having a substantially constant cross-section, which is arranged between two housing parts having an electrically conductive surface in a groove one of the housing parts, which receives the major part of the cross-section of the shielding body with lateral clearance.

Such shielding arrangements are used to shield against high frequency housings containing electronic circuits. The stranded soft elastic shielding body frequently consists of an electrically conductive elastomer or of a strand of a wire texture, which may be provided as a hose on a strand of elastic material. Since the shielding body slightly projects from the groove, a reliable electrical connection is obtained at a large number of closely adjacent points when the cover is provided so that a reliable shielding against high frequency can be attained. Since, when the housing parts are assembled, the shielding body is deformed, the groove must be slightly wider that the shielding body, which is therefore arranged in the groove with a certain amount of lateral clearance in order that the shielding body can laterally expand during the deformation. However, this involves the risk that the shielding body readily falls out of the groove in the case of separated housing parts, more particularly if the housing surface with the groove is arranged perpendicularly or even upside down.

In the magazine "Microwaves" of October 1982, there is shown on page 97 a groove having a dovetail-shaped widened part towards the groove bottom, in which a disposed shielding body is relatively held. Such groove shapes can be obtained only with great difficulty and in a complicated manner, however.

The invention therefore has for its object to provide a shielding arrangement of the kind mentioned in the opening paragraph, in which the shielding body—in spite of lateral clearance—is held in the groove in such a manner that it cannot fall out of the groove without further expedients, while the groove can be provided in a simple manner.

According to the invention, this object is achieve in that the groove changes its direction essentially at several substantially uniformly distributed points by a radius of the order of the width of the groove.

Consequently, the always present natural rigidity of the shielding body is utilized so that it is pressed due to the change of direction of the groove at least locally against the edge of the groove and is thus clamped, while, when the other housing part is arranged, a lateral expansion possibility of the shielding body is nevertheless maintained. The number and the distance of the points of direction changes depend upon the rigidity of the shielding body, upon the extent of the direction change and upon the requirements as to how firmly the shielding body should be held in the groove with an open housing.

The direction changes of the groove can be obtained in such a manner that the groove has, for example, a zigzag form. Thus, however, the groove requires a larger surface in the housing part. A more favourable solution according to an embodiment of the invention is characterized in that at each point the direction of the groove changes twice within a short period each time in opposite sense so that the groove further extends substantially continuously solely with a laterally offset part. It is more particularly advantageous that the laterally offset part is smaller than the width of the groove. Thus, due to the shape of the groove in accordance with the invention only a slightly widened surface is required in the relevant housing part without the capability of the groove of holding the shielding body being markedly adversely affected. More particularly in the latter case, it is efficacious that the change of direction amounts to about 90°. As a result, a shielding body having a low natural rigidity is also held satisfactorily.

Since in the range of the change of direction, especially if the latter is very substantial, the shielding body engages comparatively intimately the one wall of the groove, it may occur with a shielding body provided with or consisting of a wire texture that, when the housing parts are assembled, individual parts of the wire texture get between the juxtaposed housing surfaces so that the housing parts cannot be shielded uniformly mechanically and electrically. For this purpose, according to a further embodiment of the invention, it is efficacious that at each point the groove has a widened part at the area of the surface. Efficaciously, this widened part is proportioned so that any projecting parts of the shielding body are located with certainty at the area of this widened part when the housing parts are assembled so that these projecting parts cannot adversely affect the mechanically close juxtaposed position of the housing parts.

In order that the invention may be readily carried out, it will now be described more fully, by way of example, with reference to the accompanying drawings, in which:

FIG. 1 shows two housing parts with a groove for receiving the shielding body in one housing part, FIGS. 2 and 3 show two possible embodiments of changes of direction in the form of the groove, FIG. 4 shows a cross-section along the line 4—4 of FIG. 3 in the direction of the arrows of a part of the housing and the groove with the shielding body arranged therein.

FIG. 1 shows of a housing part 1 the region on which a cover 2 should be secured. This is effected by means of screws through holes 6 in the cover, which are screwed, for example, into threaded bores 5. An electronic circuit arrangement (not shown) is incorporated in the open region 4 of the housing part 1.

The surface of the housing part 1 is provided, for example by milling, with a groove 3, which extends in the form of a closed ring around the whole edge of the housing part 1. This groove exhibits at points 7 changes in direction, i.e. in the form of a laterally offset part. In this groove 3 is arranged a shielding body, which has a conductive surface and projects above the surface of the housing part 1 so that, when the cover 2 is secured by screwing, electrically conductive connections are established between the housing part 1 and the cover 2 both consisting of an electrically conductive metal through the shielding body at a very large number of points at a small relative distance. As a result, a shield against high frequency is guaranteed.

FIG. 2 shows a section of the surface of the housing part 1, in which a zigzag groove is formed. At the points 7 the direction of the groove 3 changes each time so that a shielding body arranged therein engages the inner side of the respective arc of the groove due to its natural rigidity. Such grooves are usually formed on numerically controlled milling machines so that it is possible without a considerable increase in cost to obtain substantially arbitrary forms of such a groove. Thus, it is possible to obtain a groove with several changes in direction without a substantial increase in cost.

However, FIG. 2 shows that such a zigzag form of a groove requires a wide edge of the housing 1 as compared with the width of the groove unless it is ensured that the arcs of the groove succeed each other very closely. Another possibility is shown in FIG. 3, in which the groove 3 in the surface of the housing part 1 has at the point 7 a laterally offset part. Such an offset part can readily be obtained in that, when the groove 3 is milled, the advancement is changed in direction by 90° for a short time at the point 7, after which the milling operation is continued again in the original direction.

When a shielding body is arranged, the latter engages the inner lateral surfaces of the arcs of the groove 3 so that especially with a shielding body consisting at least at the surface of a coating wire texture, individual parts of the texture can be pressed as far as above the edge of the groove over the surface of the housing part 1 and, when the cover 2 is provided, these parts of the texture are then located between the surfaces of the housing parts 1 and 2, which are then not entirely juxtaposed. For this reason, the groove 3 is widened in a region 8 close to the surface at the points 7 at least at the area of the inner arcs of said groove 3. This is described with reference to a sectional view 4—4 of the edge of the housing 1 shown in FIG. 4. In the groove 3 is arranged a shielding body consisting of a circular core 9 of elastic material, which is coated with a texture 10 of metal wires. Because of the form of the groove 3 in FIG. 3, this shielding body is pressed against the lefthand wall of this groove. The groove 3 now has at the area of the surface a widened part 8 so that a part of the texture 10 projecting above the bottom of this widened part cannot get between the two juxtaposed surfaces of the housing parts 1 and 2 when the cover is provided.

What is claimed is:

1. An electromagnetic shielding arrangement with a stranded soft elastic shielding body having a substantially constant cross-section which is arranged between two housing parts having an electrically conducting surface in a groove of one of the housing parts, which groove receives the major part of the cross-section of the shielding body with lateral clearance, characterized in that the groove changes its direction essentially at several substantially uniformly distributed points by a radius of the order of the width of the groove.

2. A shielding arrangement as claimed in claim 1, characterized in that the groove changes its direction at each point twice within a short period each time in opposite sense so that the groove extends substantially continuously futher at each point solely with a laterally offset part.

3. A shielding arrangement as claimed in claim 2, characterized in that the laterally offset part is smaller than the width of the groove.

4. A shielding arrangement as claimed in any one of claims 1 to 3, characterized in that the change in direction amounts to about 90°.

5. A shielding arrangement as claimed in claim 4, characterized in that the groove has at each point a widened part at the area of the surface.

6. A shielding arrangement as claimed in any one of claims 1 to 3, characterized in that the groove has at each point a widened part at the area of the surface.

* * * * *